United States Patent
Matsuki

(10) Patent No.: US 8,581,350 B2
(45) Date of Patent: Nov. 12, 2013

(54) FIELD EFFECT TRANSISTOR AND SEMICONDUCTOR DEVICE, AND METHOD FOR MANUFACTURING SAME

(75) Inventor: Takeo Matsuki, Ibaraki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/478,394

(22) Filed: May 23, 2012

(65) Prior Publication Data

US 2012/0228680 A1 Sep. 13, 2012

Related U.S. Application Data

(62) Division of application No. 11/935,432, filed on Nov. 6, 2007, now abandoned.

(30) Foreign Application Priority Data

Nov. 6, 2006 (JP) ................................. 2006-300487

(51) Int. Cl.
  *H01L 21/70* (2006.01)
  *H01L 29/78* (2006.01)
(52) U.S. Cl.
  USPC ........... 257/407; 257/368; 257/382; 257/383; 257/384; 257/388; 257/412; 257/E29.134; 257/E29.135; 257/E29.126
(58) Field of Classification Search
  USPC .................. 257/382, 383, 384, 388, E21.636, 257/E21.637
  See application file for complete search history.

(56) References Cited

U.S. PATENT DOCUMENTS

| | | | |
|---|---|---|---|
| 6,410,376 B1 * | 6/2002 | Ng et al. ........................ | 438/199 |
| 6,444,512 B1 * | 9/2002 | Madhukar et al. ............. | 438/203 |
| 6,563,178 B2 * | 5/2003 | Moriwaki et al. ............. | 257/369 |
| 6,586,288 B2 * | 7/2003 | Kim et al. ...................... | 438/183 |
| 6,977,194 B2 * | 12/2005 | Belyansky et al. ............ | 438/197 |
| 7,081,409 B2 * | 7/2006 | Kang et al. ..................... | 438/681 |
| 2006/0124974 A1 | 6/2006 | Cabral et al. | |

FOREIGN PATENT DOCUMENTS

| | | |
|---|---|---|
| JP | 2002-093921 | 3/2002 |
| JP | 2005-057301 | 3/2005 |
| JP | 2005-303261 | 10/2005 |

OTHER PUBLICATIONS

J. Welser et al., "Electron Mobility Enhancement in Strained-Si N-Type Metal-Oxide-Semiconductor Field-Effect Transistors", Mar. 1994, 4 pages, IEEE Electron Device Letters, vol. 15, No. 3.
Shinya Ito et al., "Mechanical Stress Effect of Etch-Stop Nitride and its Impact on Deep Submicron Transistor Design", 3 pages, IEEE.
T. Ghani et al., "A 90nm High Volume Manufacturing Logic Technology Featuring Novel 45nm Gate Length Strained Silicon CMOS Transistors", 4 pages, IEEE.
H.-J. Cho et al., "The Effects of TaN Thickness and Strained Substrate on the Performance and PBTI Characteristics of Poly-Si/TaN/HfSiON MOSFETs", 3 pages, IEEE.

* cited by examiner

*Primary Examiner* — S. V. Clark
*Assistant Examiner* — Jesse Y Miyoshi
(74) *Attorney, Agent, or Firm* — Young & Thompson

(57) ABSTRACT

Current drive efficiency is deteriorated in the conventional FET. The FET 20 includes an electrode film 24a provided over the semiconductor substrate 10 and a stressor film 24b that is provided on the electrode film 24a and constitutes a gate electrode 24 together with the electrode film 24a. Each of the electrode film 24a and the stressor film 24b is composed of a metal, a metallic nitride or a metallic silicide. The stressor film 24b is capable of exhibiting a compressive stress over the semiconductor substrate 10.

10 Claims, 15 Drawing Sheets

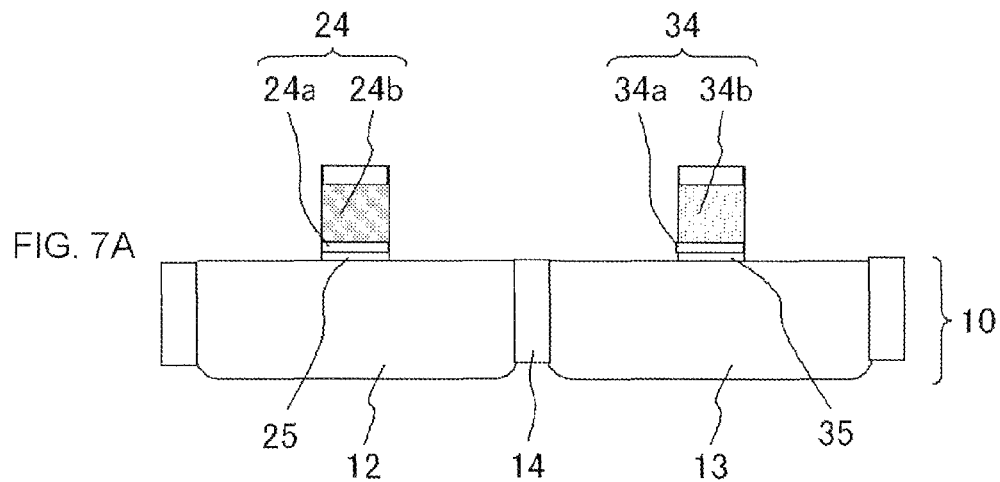
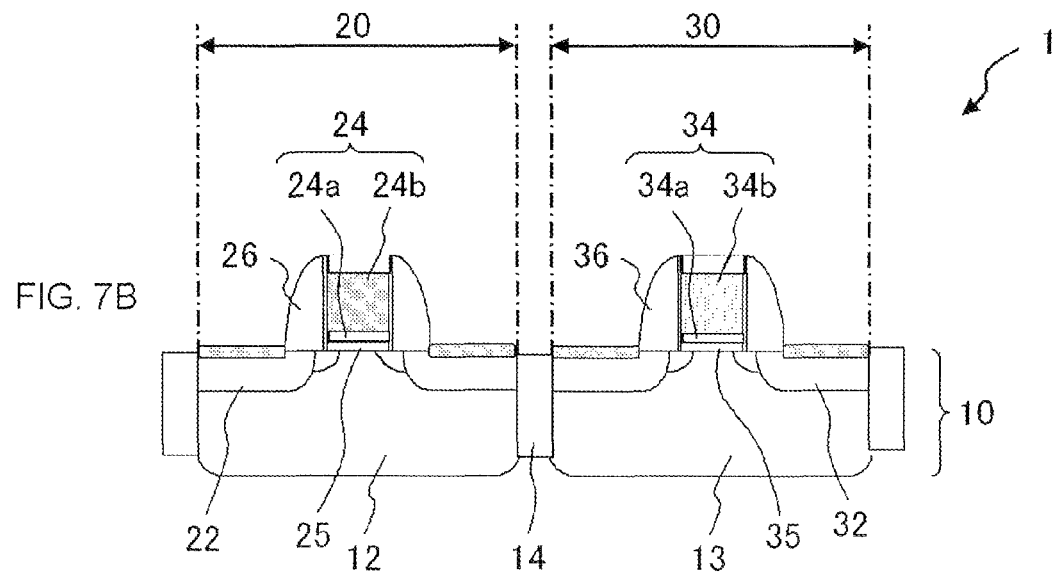

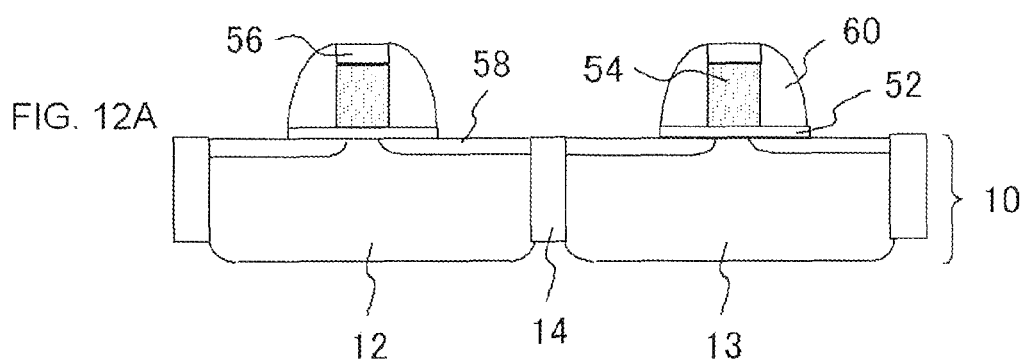
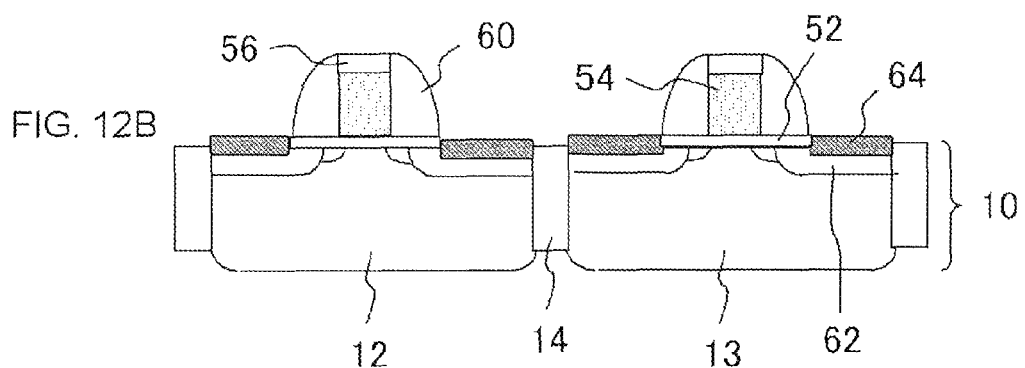

FIELD EFFECT TRANSISTOR AND SEMICONDUCTOR DEVICE, AND METHOD FOR MANUFACTURING SAME

CROSS REFERENCE TO RELATED APPLICATIONS

This application is a division of co-pending application Ser. No. 11/935,432 filed on Nov. 6, 2007, which claims foreign priority to Japanese Application No. 2006-300487 filed on Nov. 6, 2006. The entire content of each of these applications is hereby expressly incorporated by reference.

BACKGROUND

1. Technical Field

The present invention relates to a field effect transistor and a semiconductor device, and to a method for manufacturing thereof.

2. Related Art

Metal insulator semiconductor field effect transistors (MISFET), which are composed of silicon and polycrystalline silicon employed as materials for semiconductor substrate and gate electrode, respectively, exhibit progressively improved performances by virtue of processing technologies for fine devices, various types of deposition technologies and impurity control technologies. Semiconductor devices having various functions are configured by combining different MISFETs that exhibits different threshold voltage properties. In particular, a considerable improvement in the current drive efficiency is obtained by a scaledown of devices. Besides, a MISFET having an oxide film such as silicon oxide film employed as a gate insulating film is particularly referred to as metal oxide semiconductor field effect transistor (MOSFET).

Prior art literatures related to the present invention include: Japanese Patent Laid-Open No. 2002-93921; Japanese Patent Laid-Open No. 2005-57301; Japanese Patent Laid-Open No. 2005-303261; J. Welser, J. L. Hoyt, and J. F. Gibbons, IEEE Electron Device Letters, Vol. 15, No 3 (1994), p. 100-102, entitled "Electron Mobility Enhancement in Strained-Si N-type Metal-Oxide-Semiconductor Field-Effect Transistors";

S. Itoh et al., Technical Digest of 2000 International Electron Device Meeting (2000), p. 247-250, entitled "Mechanical Stress Effect of Etch-Stop Nitride and its Impact on Deep Submicron Transistor Design";

T. Ghani et al., Technical Digest of 2003 International Electron Device Meeting (2003), p. 978-980, entitled "A 90 nm High Volume Manufacturing Logic Technology Featuring Novel 45 nm Gate Length Strained Silicon CMOS Transistors"; and H. J. Cho et al., Technical Digest of 2004 International Electron Device Meeting (2004), p. 503-506, entitled "The Effects of TaN Thickness and Strained Substrate on the Performance and PBTI Characteristics of Poly-Si/TaN/HfSiON MOSFETs".

Nevertheless, a scaledown of devices causes a reduced channel-length of FET, causing a difficulty in controlling an electric current in the channel region by employing a gate voltage (electric charge control). A known solution for such difficulty is an utilization of an increased impurity concentration in the channel region of the semiconductor substrate to thereby improve the controllability. However, such process causes an increased scattering of charged carrier (electronic electron hole) by the presence of impurity, deteriorating the current drive efficiency.

SUMMARY

According to one aspect of the present invention, there is provided an n-channel field effect transistor, comprising: a first electrode film provided over a semiconductor substrate; and a second electrode film provided on the first electrode film, the second electrode film and the first electrode film constituting a gate electrode, wherein at least one of the first electrode film and the second electrode film is a stressor film that is capable of exhibiting a compressive stress over the semiconductor substrate, and wherein each of the first and the second electrode films is composed of a metal, a metallic nitride or a metallic silicide.

In such n-channel FET, at least one of the first electrode film and the second electrode film is a stressor film that is capable of exhibiting a compressive stress over the semiconductor substrate. Such stressor film draws the channel region toward the outer direction, thereby providing an improved electron mobility.

According to another aspect of the present invention, there is provided a p-channel field effect transistor, comprising: a first electrode film provided over a semiconductor substrate; and a second electrode film provided on the first electrode film, the second electrode film and the first electrode film constituting a gate electrode, wherein at least one of the first electrode film or the second electrode film is a stressor film that is capable of exhibiting a tensile stress for the semiconductor substrate, and wherein each of the first and the second electrode films is composed of a metal, a metallic nitride or a metallic silicide.

In such p-channel FET, at least one of the first electrode film and the second electrode film is a stressor film that is capable of exhibiting a tensile stress for the semiconductor substrate. Such stressor film provides a compressed channel region, thereby providing an improved hole mobility.

Besides, determinations of a tensile stress and a compressive stress in this specification are presented as follows.

Assume that a stress is exerted on a film formed on a substrate through a unit area of a vertical cross-section thereof that is perpendicular to a surface of the substrate, the stress is determined as a tensile stress when the stress transversely acts as pulling the vertical cross-section from both sides via the vertical cross-section, and on the other hand, the stress is determined as a compressive stress when the stress transversely acts as pushing the vertical cross-section from both sides via the vertical cross-section. For example, when a film is to be shrunk, a tensile stress exerts through the film, resulting in a compressive distortion caused in the surface of the substrate. When a film is to be expanded, a compressive stress exerts through the film, resulting in a tensile distortion caused in the surface of the substrate.

According to the present invention, the FET that exhibits an improved mobility of charge carrier and the semiconductor device comprising thereof, and the method for manufacturing thereof are achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 7A and 7B are cross-sectional views of the semiconductor device, illustrating the embodiment of the process for manufacturing the semiconductor device according to the present invention;

FIGS. 12A and 12B are cross-sectional views of the semiconductor device, illustrating another embodiment of the process for manufacturing the semiconductor device according to the present invention;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations of FETs and semiconductor devices and methods for manufacturing thereof according to the present invention will be described in reference to the annexed figures. In all figures, identical numeral is assigned to an element commonly appeared in the description of the present invention in reference to the figures, and the detailed description thereof will not be repeated.

Figure 1:
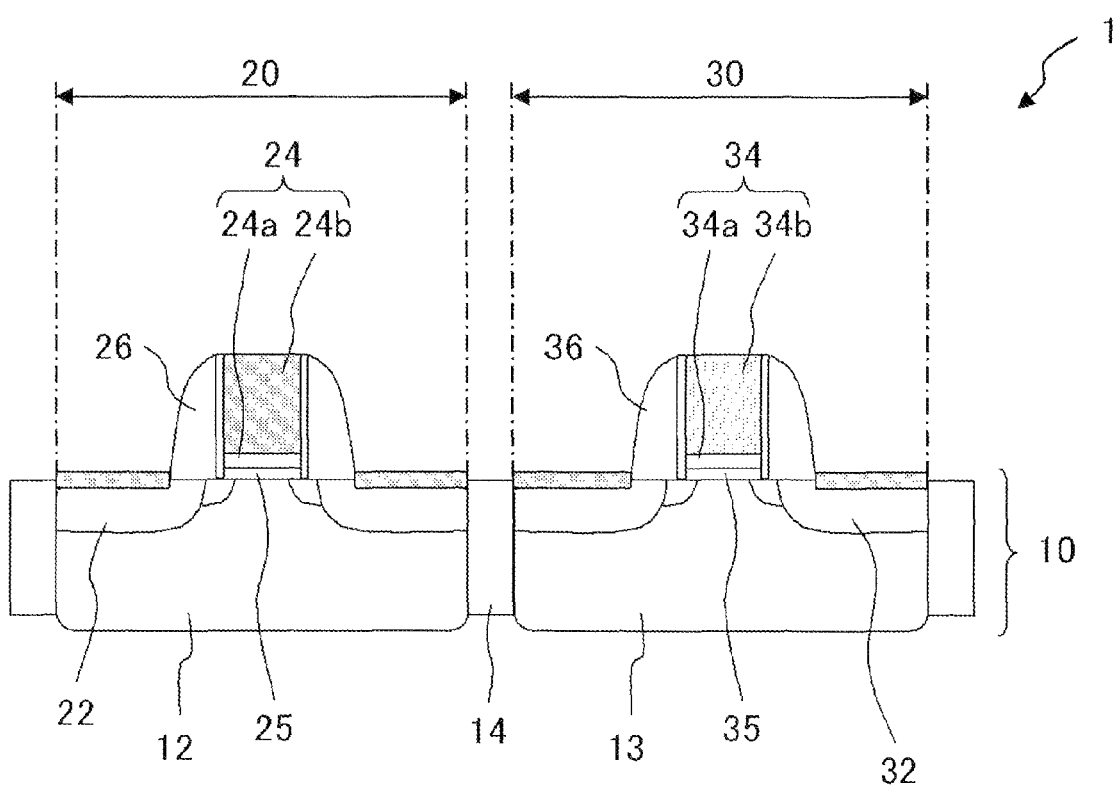
FIG. 1 a cross-sectional view of a semiconductor device, illustrating an embodiment of a semiconductor device according to the present invention.

FIG. 1 is a cross-sectional view, illustrating an embodiment of a semiconductor device according to the present invention. A semiconductor device 1 includes an n-channel FET 20 and a p-channel FET 30. These FETs 20 and 30 are formed in one semiconductor substrate 10. In the present embodiment, the semiconductor substrate 10 is a silicon substrate. The semiconductor substrate 10 is provided with a p-well region 12, an n-well region 13, and an element isolation region 14 formed therein. The FET 20 is isolated form the FET 30 by the element isolation region 14. The element isolation region 14 is, for example, a shallow trench isolation (STI).

The FET 20 includes an electrode film 24a (first electrode film) provided over the semiconductor substrate 10 and a stressor film 24b (second electrode film) that is provided on the electrode film 24a and constitutes a gate electrode 24 together with the electrode film 24a. Each of the electrode film 24a and the stressor film 24b is composed of a metal, a metallic nitride or a metallic silicide. The electrode film 24a is provided on a channel region of the semiconductor substrate 10 through the gate insulating film 25 therebetween. The stressor film 24b is capable of exhibiting a compressive stress over the semiconductor substrate 10. Such stressor film 24b is preferably deposited by a sputter process. Available materials for the stressor film 24b typically include tungsten (W), molybdenum (Mo), titanium (Ti), tantalum (Ta), and ruthenium (Ru), and a nitride thereof. Among these, W or Mo deposited by a sputter process is particularly preferable.

The gate electrode 24 and the gate insulating film 25, and the source-drain region 22 formed in the p-well region 12 and the like constitute the FET 20. Further, a side wall film 26 is provided on the side surface of the gate electrode 24.

The FET 30 includes an electrode film 34a (first electrode film) provided over the semiconductor substrate 10 and a stressor film 34b (second electrode film) that is provided on the electrode film 34a and constitutes a gate electrode 34 together with the electrode film 34a. Each of the electrode film 34a and the stressor film 34b is composed of a metal, a metallic nitride or a metallic silicide. The electrode film 34a is provided on a channel region of the semiconductor substrate 10 through the gate insulating film 35 therebetween. The stressor film 34b is capable of exhibiting a tensile stress for the semiconductor substrate 10.

Such stressor film 34b is preferably deposited by a chemical vapor deposition (CVD) process. Available materials for the stressor film 34b typically include W, Mo, Ti, Ta, and Ru, and a nitride thereof. Among these, W deposited by a CVD process is particularly preferable.

The gate electrode 34 and the gate insulating film 35, and the source-drain region 32 formed in the n-well region 13 and the like constitute the FET 30.

Further, a side wall film 36 is provided on the side surface of the gate electrode 34.

As described above, the electrode film 24a is provided in the FET 20 so as to be in contact with the gate insulating film 25, and the electrode film 34a is provided in the FET 30 so as to be in contact with the gate insulating film 35. Here, when the threshold voltage of FET 20 is to be intended to be equal to or lower than, for example, 0.5 V, the material of the electrode film 24a preferably exhibits a work function of within a range of from 3.9 to 4.3 eV. Such materials include tantalum nitride (TaN), tantalum silicon nitride (TaSiN), aluminum (Al), Ta, Mo and the like. In addition to above, the work function employed here may be an effective work function, which additionally evaluates a reaction and an equilibrium of electric charge in the interface with the gate insulating film 25. If it is intended to obtain a larger threshold voltage, a metal silicide exhibiting a work function of about 4.5 eV may be alternatively employed.

Similarly, when the threshold voltage of FET 30 is to be intended to be equal to or lower than, for example, 0.5 V, the material of the electrode film 34a preferably exhibits a work function of within a range of from 4.7 to 5.1 eV. Such materials include titanium nitride (TiN), platinum (Pt), iridium (Ir), Ru, rhenium (Re), nickel silicide (Ni3Si), nickel silicide (Ni31Si12) and the like.

Here, a film thickness of each of the electrode films 24a and 34a is, for example, 1 to 20 nm. A film thickness of each of the stressor films 24b and 34b is, for example, 20 to 50 nm. The film thickness of the stressor film 24b may be the same as or may be different from the film thickness of the stressor film 34b.

In reference to FIGS. 2A and 2B, FIGS. 3A and 3B, FIGS. 4A and 4B, FIGS. 5A and 5B, FIGS. 6A and 6B and FIGS. 7A and 7B, an example of a method for manufacturing the semiconductor device 1 will be illustrated as a configuration of a process for manufacturing the semiconductor device according to the present invention. Such method includes a process for manufacturing the FET 20 and a process for manufacturing the FET 30. The process for manufacturing the FET 20 includes a process for forming the electrode film 24a on the semiconductor substrate 10 and a process for forming the stressor film 24b on the electrode film 24a. Similarly, the process for manufacturing the FET 30 includes a process for forming the electrode film 34a on the semiconductor substrate 10 and a process for forming the stressor film 34b on the electrode film 34a.

Figure 2A:
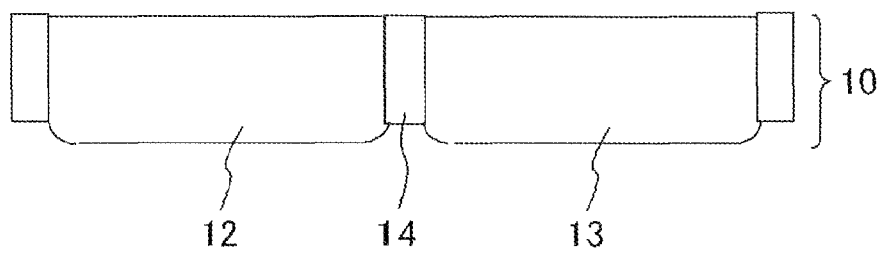
FIGS. 2A and 2B are cross-sectional views of a semiconductor device, illustrating an embodiment of a process for manufacturing the semiconductor device according to the present invention.
Figure 2B:
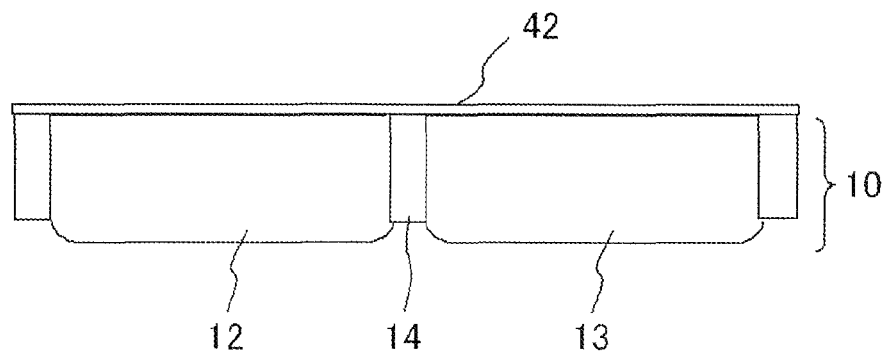

More specifically, the p-well region 12, the n-well region 13 and the element isolation region 14 are, first of all, formed in the semiconductor substrate 10 (FIG. 2A). Subsequently, an insulating film 42, which will serve as the gate insulating films 25 and 35, is formed on the semiconductor substrate 10. Materials employed for the insulating film 42 preferably includes silicon oxynitride film, and films having higher specific dielectric constant than silicon oxynitride film such as hafnium oxide film, hafnium silicon oxide film, hafnium nitride-silicon oxide film and the like (FIG. 2B).

Figure 3A:
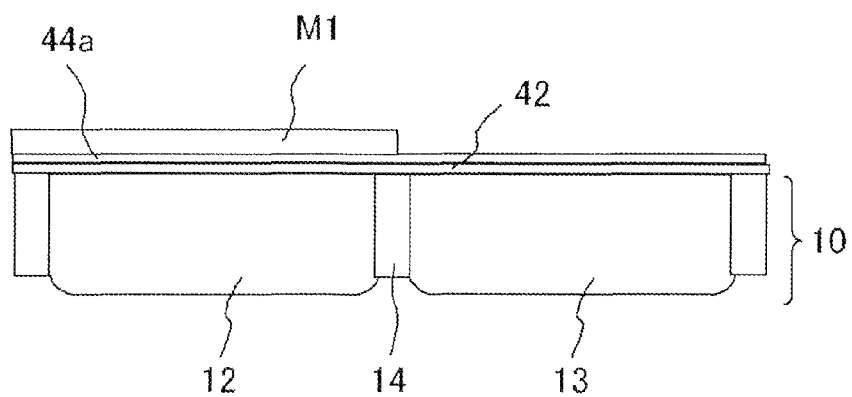
FIGS. 3A and 3B are cross-sectional views of the semiconductor device, illustrating the embodiment of the process for manufacturing the semiconductor device according to the present invention.
Figure 3B:
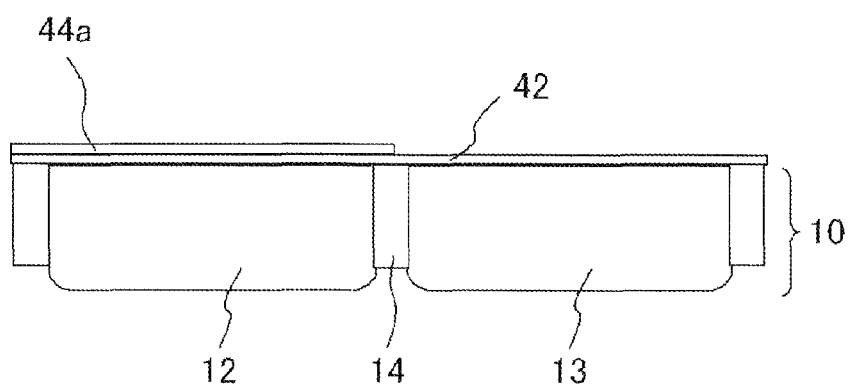

Next, an electrode film 44a, which will serve as the electrode film 24a, is formed on the insulating film 42. Then, a mask M1 is selectively arranged so as to cover the electrode film 44a on the p-well region 12. Materials employed for the mask M1 include, for example, a silicon oxide film (FIG. 3A). Subsequently, the mask M1 is utilized to selectively remove the electrode film 44a to partially expose the insulating film 42 on the n-well region 13. Here, it is preferable to suitably adjust the respective film thickness, so that the mask M1 be eliminated in the process for removing the electrode film 44a (FIG. 3B).

Figure 4A:
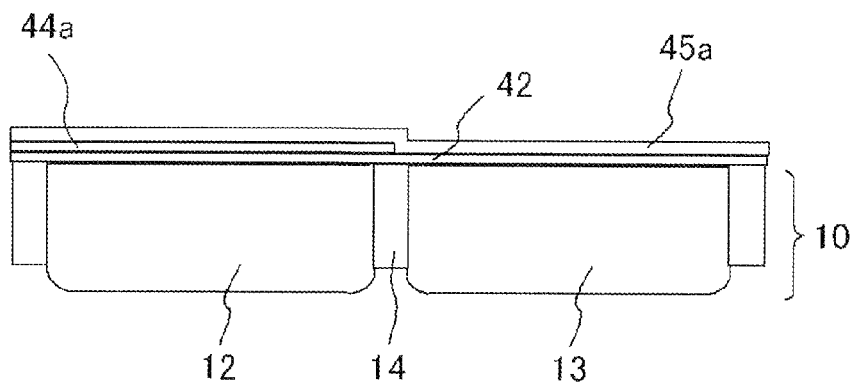
FIGS. 4A and 4B are cross-sectional views of the semiconductor device, illustrating the embodiment of the process for manufacturing the semiconductor device according to the present invention.
Figure 4B:
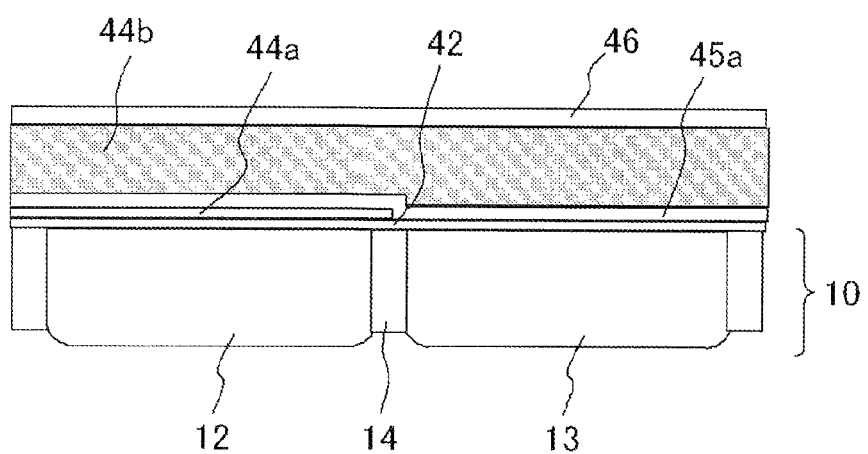

Next, the electrode film 45a, which will serve as the electrode film 34a, is formed on the insulating film 42 and the electrode film 44a (FIG. 4A). Subsequently, a stressor film 44b, which will serve as the stressor film 24b, is formed on the electrode film 45a. Such stressor film 44b is preferably deposited by a sputter process at a temperature higher than a room temperature. Further, an etch stop film 46 is formed on the stressor film 44b. Here, the etch stop film 46 may preferably have a selectivity for the stressor film 45b as will be discussed later. For example, when the stressor film 45b is a tungsten (W) film deposited by a CVD process, a titanium nitride film may be preferably employed for the etch stop film 46 (FIG. 4B).

Figure 5A:
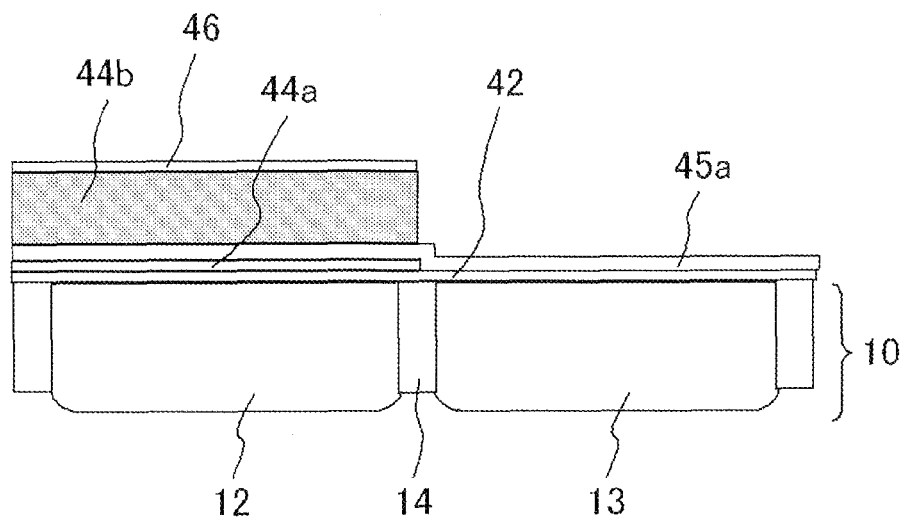
FIGS. 5A and 5B are cross-sectional views of the semiconductor device, illustrating the embodiment of the process for manufacturing the semiconductor device according to the present invention.

Next, the stressor film 44b and the etch stop film 46 disposed on the n-well region 13 are selectively removed (FIG. 5A). Subsequently, a stressor film 45b, which will serve as the stressor film 34b, is formed on the electrode film 45a and the etch stop film 46. Such stressor film 45b is preferably deposited by a CVD process at a temperature higher than a room temperature.

Figure 5B:
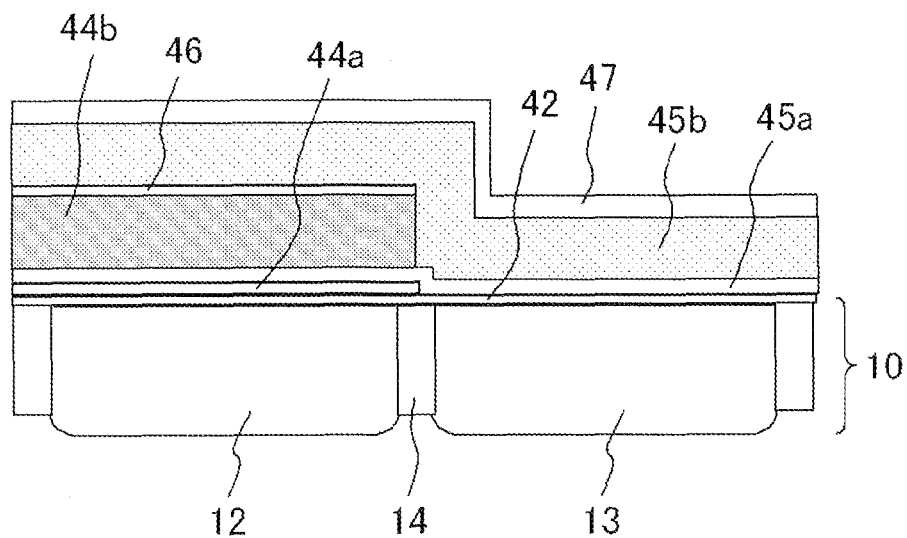

Further, an etch stop film 47 is formed on the stressor film 45b. It is preferable that the material and the thickness of such etch stop film 47 are the same as that of the above-described etch stop film 46 (FIG. 5B).

Figure 6A:
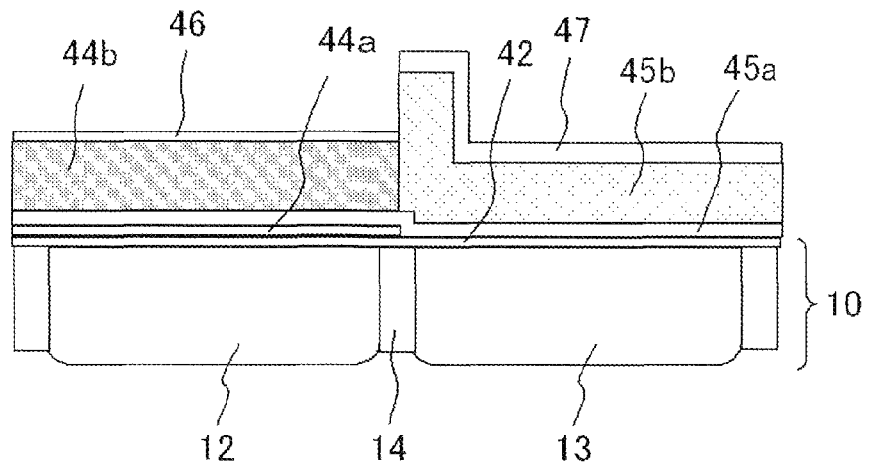
FIGS. 6A and 6B are cross-sectional views of the semiconductor device, illustrating the embodiment of the process for manufacturing the semiconductor device according to the present invention.
Figure 6B:
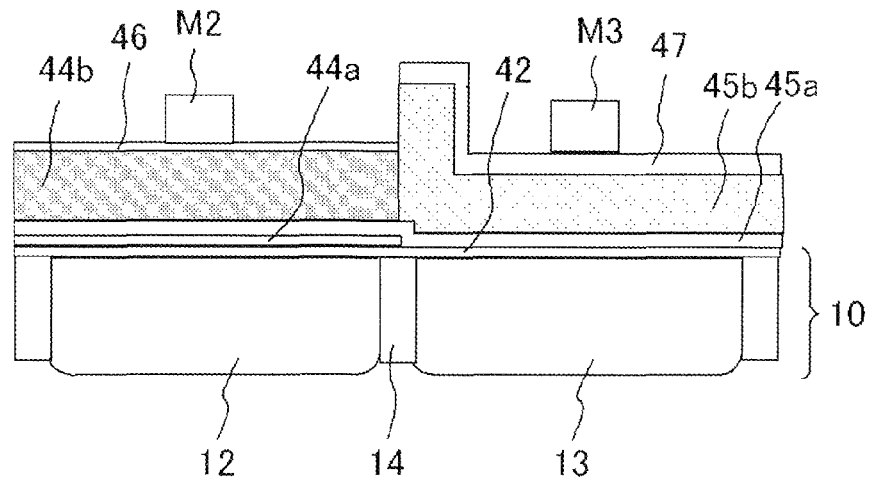

Next, the stressor film 45b and the etch stop film 47 disposed on the p-well region 12 are selectively removed (FIG. 6A). Subsequently, hard masks M2 and M3 are selectively disposed on the etch stop film 46 and 47, respectively. A silicon nitride film, for example, may be employed for the hard masks M2 and M3 (FIG. 6B). While it is illustrated that the electrode film 45a is remained on the electrode film 44a in the diagram, the electrode film 45a on the electrode film 44a may be removed before process for forming the stressor film 44b (see FIG. 4B). A configuration that the electrode film 45a is removed will be illustrated as follows.

Next, the hard mask M2 is utilized to selectively remove the etch stop film 46, the stressor film 44b, the electrode film 44a and the insulating film 42 on the p-well region 12. Further, simultaneously, the hard mask M3 is utilized to selectively remove the etch stop film 47, the stressor film 45b, the electrode film 45a and the insulating film 42 on the n-well region 13. The gate electrodes 24 and 34 and the gate insulating films 25 and 35 are formed by such process. The etch stop films 46 and 47 or the multiple-layered film composed of the etch stop films 46 and 47 and the hard masks M2 and M3 are remained on the gate electrodes 24 and 34 (FIG. 7A). Subsequently, the side wall films 26 and 36 and the source-drain regions 22 and 32 are formed, and then, a silicide is formed on the surface of the source-drain regions 22 and 32. As described above, the FETs 20 and 30 and the semiconductor device 1 including such FETs are obtained (FIG. 7B).

An advantageous effect of the present embodiment is described. In the n-channel FET 20, the stressor film 24b exhibits a compressive stress. Such stressor film 24b draws the channel region of the FET 20 toward the outer direction, thereby providing an improved electron mobility. On the other hand, in the p-channel FET 30, the stressor film 34b exhibits a tensile stress. Such stressor film 34b provides a compressed channel region of the FET 30, thereby providing an improved hole mobility. Thus, the FETs 20 and 30 exhibiting higher mobility of charge carrier and the semiconductor device 1 comprising thereof, and the method for manufacturing thereof are achieved.

Further, according to the manufacturing process of the present embodiment, the electrode films 24a and 34a having different work functions can be formed and the stressor films 24b and 34b exhibiting different stresses for the semiconductor substrate 10 can be formed. In particular, the etch stop film disposed on the stressor film is adopted to both of the FET 20 and the FET 30, so that the processing for forming the fine gate electrodes 24 and 34 can be easily achieved.

This is because a use of a condition that provides a selectivity over the underlying stressor film an increased allowance in the process for exposing the gate insulating film in the process for selectively removing the etch stop film. In addition, stressor films having different film thickness can also be formed by utilizing such manner for separately forming different stressor films. This also allows a reduced deterioration in the interfacial quality due to the influence of the film thickness of the gate electrode film, which has been pointed out in the above-described H. J. Cho et al.

Meanwhile, Japanese Patent Laid-Open No. 2002-93,921 discloses a single layer gate electrode composed of a silicon film or a metallic film or a multiple-layered gate electrode composed of silicon or a metal, in which the n-channel MOSFET and the p-channel MOSFET are designed to exhibit different stresses. However, when the multiple-layered structure is employed in the disclosed technology, the layer underlying such multiple-layered structure is a polycrystalline silicon layer, and thus a problem of agate depletion cannot be solved. On the other hand, when the single layer is employed, it is highly possible that a material having a desired work function and a desired process for depositing films can not be selected for the single layer. On the contrary, in the present embodiment, a metal, a metallic nitride or a metallic silicide is employed for the first and the second electrode films that constitute the multiple-layered structure of the gate electrode. In particular, the configuration is composed of the lower layer electrode that contributes a work function and the upper layer electrode that contributes a stress design of the whole gate electrode, so that the determination of the work function can be independently performed from the stress design of the whole gate electrode.

Figure 8:
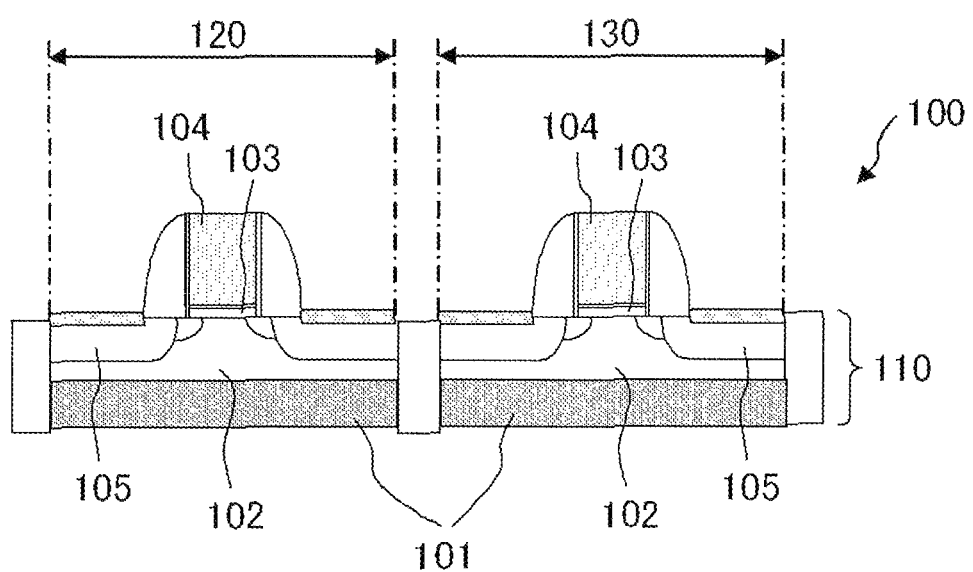
FIG. 8 is a cross-sectional view, illustrating a conventional semiconductor device.

FIG. 8 is a cross-sectional view, illustrating a semiconductor device disclosed by the above-described J. Welser, J. L. Hoyt, and J. F. Gibbons. A semiconductor device 100 shown in FIG. 8 according to J. Welser et al. includes an n-channel MOSFET 120 and a p-channel MOSFET 130. The MOSFETs 120 and 130 are formed in a strained silicon substrate 110. The strained silicon substrate 110 includes a mixed crystal film 101 of silicon and germanium (SiGe film) and a silicon film 102 formed thereon. A lattice relaxation of the SiGe film 101 is achieved so as to have larger effective lattice constant than silicon in the silicon film 102. A gate electrode 104 composed of a polycrystalline silicon is provided on the silicon film 102 by a gate insulating film 103 composed of a silicon oxide film. Further, a source-drain region 105 is formed in the silicon film 102.

The silicon film 102 is strained, since the silicon film is epitaxially grown on the SiGe film 101 that have larger lattice constant than the silicon film. In the example presented by J. Welser, a comparison in the performances is carried out by evaluating the effective electric field mobility, and it is concluded that an improvement by +80% is achieved as compared with a MOSFET formed on an ordinary silicon substrate. However, a use of such strained silicon substrate 110 causes an increased cost, as compared with the use of an ordinary silicon substrate.

Figure 9:
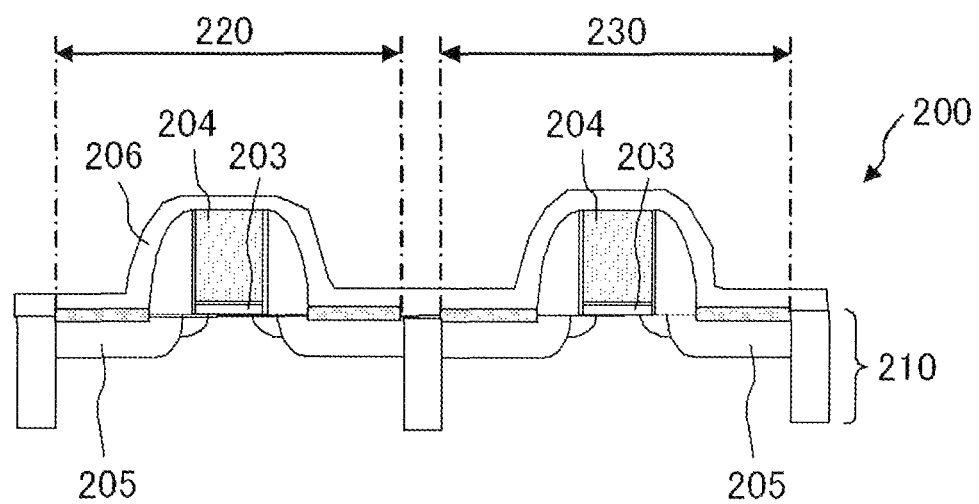
FIG. 9 is a cross-sectional view, illustrating a conventional semiconductor device.

FIG. 9 is a cross-sectional view, illustrating a semiconductor device disclosed by the above-described S. Itoh et al. A semiconductor device 200 shown in FIG. 9 according to S. Itoh et al. includes an n-channel MOSFET 220 and a p-channel MOSFET 230. A gate electrode 204 is provided on the silicon substrate 210 by a gate insulating film 203.

Further, a source-drain region 205 is formed in the silicon substrate 210.

Further, a plasma silicon nitride film 206 is formed so as to cover the gate electrode 204 and the source-drain region 205. Such plasma silicon nitride film 206 exhibits a tensile stress for the silicon substrate 210. It is described that the tensile stress allows providing an improved electron current-driving capability of the MOSFET 220. However, on the other hand, hole mobility in the MOSFET 230 is deteriorated.

Figure 10:
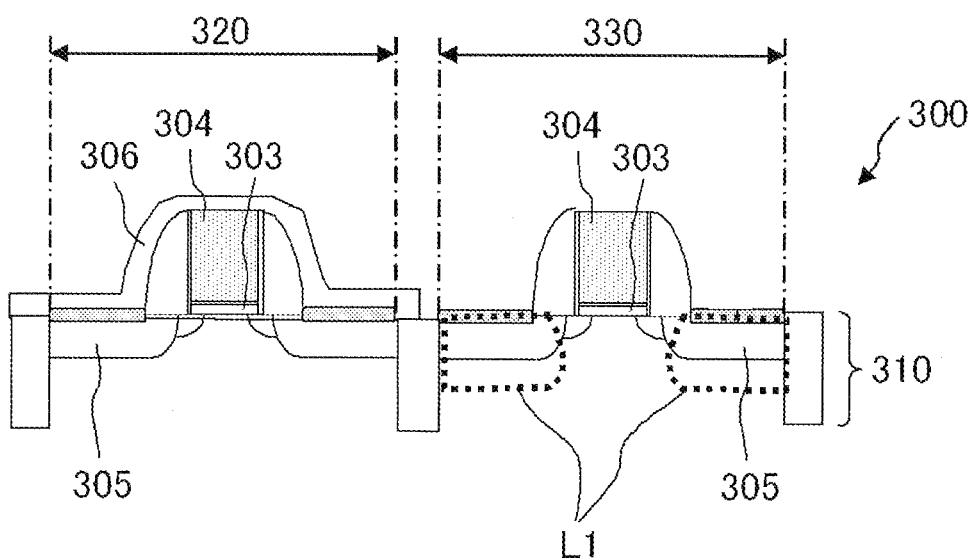
FIG. 10 is a cross-sectional view, illustrating a conventional semiconductor device.

FIG. 10 is a cross-sectional view, illustrating a semiconductor device disclosed by the above-described T. Ghani et al. A semiconductor device 300 shown in FIG. 10 according to T. Ghani et al. includes an n-channel MOSFET 320 and a p-channel MOSFET 330.

A gate electrode 304 is provided on the silicon substrate 310 by a gate insulating film 303.

Further, a source-drain region 305 is formed in the silicon substrate 310. A plasma silicon nitride film 306, which is capable of exhibiting a tensile stress for the silicon substrate 310, is formed, so as to cover the gate electrode 304 and the source-drain region 305. Such plasma silicon nitride film 306 is provided only in the MOSFET 320.

Further, a silicon-germanium (SiGe) having larger lattice constant than silicon is embedded in the source-drain region 305 of the MOSFET 330 (region surrounded with dotted line L1). It is described that this provides a compressed channel region of the MOSFET 330, thereby providing an improved hole mobility. However, such structure requires a complicated manufacturing process, resulting in a higher production cost.

The above-described H. J. Cho et al. discloses a manner of disposing a metallic film on a gate insulating film, in order to reduce a gate capacitance, which is generated in the case that a polycrystalline silicon is employed for the gate electrode. A typical example of employing a gate electrode, which is composed of a multiple-layered film of a polycrystalline silicon and tantalum nitride (TaN), is disclosed therein. In this example, a problem of an increased state density at an interface due to a reaction of TaN with polycrystalline silicon is presented, when a polycrystalline silicon is deposited on a TaN film having a thickness of 3 nm and then a heat-treating for activating an impurity contained in the source drain. Further, it is also disclosed that, when the thickness of the TaN film is selected as 5 nm and 10 nm, a gate capacitance and a flat band voltage are changed, and thus thicker film thickness provides further improved positive bias temperature instability. However, when a metal described in the above-described H. J. Cho et al. is employed for the gate electrode, a fluctuation in the thickness of the metallic film is easily affects the device characteristics.

Japanese Patent Laid-Open No. 2005-57,301 discloses designing a compressive stress of the gate electrode in an n-MOSFET than that pf a p-MOSFET. Besides, a gate electrode film that is capable of exhibiting a compressive stress for the p-MOSEFT is adopted in the technology disclosed in Japanese Patent Laid-Open No. 2005-57,301. On the contrary, in the present embodiment according to the present invention, the p-MOSEFT is also provided with a gate electrode film that is capable of exhibiting a tensile stress. Further, Japanese Patent Laid-Open No. 2005-57,301 discloses no description of the configuration having the gate electrode composed of a plurality of films, one or more of which is designed to exhibit a compressive stress or a tensile stress to provide such type of stress for the whole gate electrode. When a compatibility with a gate insulating film is considered, it may also be a case where a desired type of the stress in the film that is in contact with the gate insulating film can not be achieved, and even in such case, a total stress can be suitably designed by suitably selecting a film that overlays the gate insulating film according to the present invention.

Japanese Patent Laid-Open No. 2005-303,261 discloses a configuration of a device where a gate electrode exhibiting a compressive stress is provided in an n-MOSFET and a gate electrode exhibiting a tensile stress is provided in a p-MOSFET. However, such configuration is totally different from the present embodiment according to the present invention, in terms of employing a silicide for the compressive stressor film and employing a single layer film for the gate electrode film.

Figure 11A:
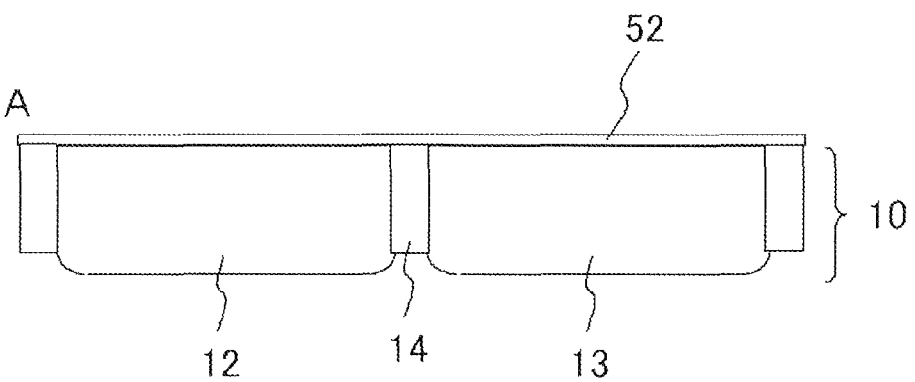
FIGS. 11A and 11B are cross-sectional views of a semiconductor device, illustrating another embodiment of a process for manufacturing the semiconductor device according to the present invention.

In reference to FIGS. 11A and 11B, FIGS. 12A and 12B, FIGS. 13A and 13B, FIGS. 14A and 14B and FIGS. 15A and 15B, an alternative example of a method for manufacturing a semiconductor device will be illustrated. First of all, a p-well region 12, an n-well region 13 and an element isolation region 14 are formed in a semiconductor substrate 10. Thereafter, a sacrificial gate insulating film 52 is formed on the semiconductor substrate 10 by a thermal oxidation process or a CVD process. A preferable material for the sacrificial gate insulating film 52 includes, for example, a silicon oxide film. Further, a film thickness of the sacrificial gate insulating film 52 may be preferably about 1 to 5 nm, and for example, may be 2 nm (FIG. 11A).

Figure 11B:
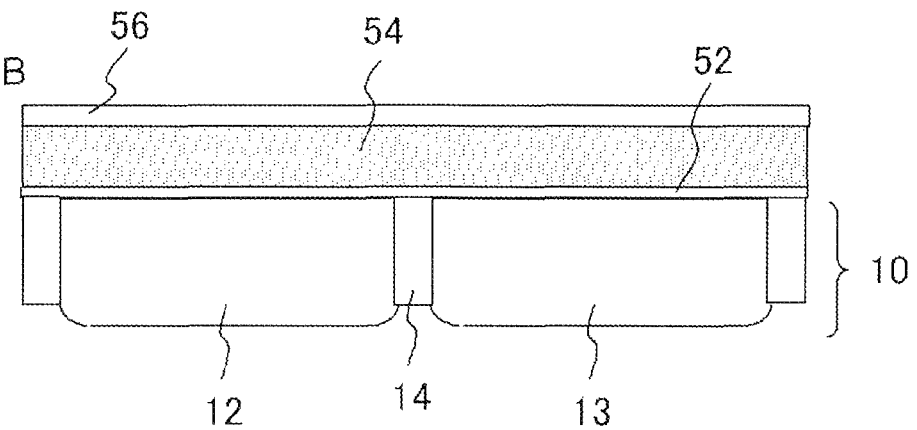

Next, a sacrificial gate electrode film 54 and a hard mask film 56 are deposited on the sacrificial gate insulating film 52. A material for the sacrificial gate electrode film 54 is preferably a polycrystalline silicon or an amorphous silicon. Since a use of silicon provides higher etch selectivity over the sacrificial gate insulating film 52, the etching of the sacrificial gate electrode film 54 in the later operation can be easily achieved. A CVD process may be preferably employed for depositing the sacrificial gate electrode film 54. When an amorphous silicon is employed, an influence of crystal plane orientation can be inhibited in the processing of such sacrificial gate electrode film 54, thereby reducing a deterioration in a linearity of the processed end portion. When a number of elements are collectively disposed according to the above-described manner, an advantageous effect of reducing a statistical variation in the characteristics of devices can be expected. The film thickness of the sacrificial gate electrode film 54 depends upon dimensions of elements, and may be preferably about 50 nm, for example. On the other hand, the hard mask film 56 may be preferably a silicon nitride film or a silicon oxide film. In the present case, a silicon nitride film is employed. The thickness of the hard mask film 56 may be preferably, for example, about 30 nm (FIG. 11B).

Next, the hard mask film 56 and the sacrificial gate electrode film 54 are selectively removed by a known lithographic technology and a processing technology. Subsequently, a source drain extension 58 is formed. In order to reducing so-called short-channel effect, an impurity that creates the same type conductivity as the well has may be introduced by halo implant or pocket implant as required. An ion implantation process by utilizing lower energy may be preferably employed for forming the source drain extension 58. It is preferable to implant arsenic (As) with an accelerating energy of equal to or lower than 1 kV in the n-MOSFET (MOSFET shown in left side of drawing). On the other hand, it is also preferable to implant boron difluoride (BF2) or indium (In) by similarly utilizing lower accelerating energy in the p-MOSFET (MOSFET shown in right side of drawing). Thereafter, a gate sidewall film 60 is formed (FIG. 12A). The gate side wall film 60 is obtained by, for example, forming a silicon nitride film to a thickness of 40 nm, and then etching back thereof at a condition for providing a higher selectivity with underlying silicon film or underlying silicon oxide film.

Next, a source-drain region 62 is formed. Further, a silicide layer 64 is formed on the surface of the source-drain region 62 (FIG. 12B). The source-drain region 62 may be formed by an ion implantation process. Arsenic (As) ion may be preferably employed for the n-MOSFET and boron (B) or BF2 ion may be preferably employed for the p-MOSFET. After the ion implantation, an annealing process is performed at a temperature of around 1,000 degree C. to electrically activate an implanted impurity. The silicide layer 64 may be preferably nickel silicide (NiSi) layer, for example. The NiSi layer may be obtained by, for example, depositing nickel (Ni) by a sputter process, and heat-treating thereof at a temperature of around 450 degree C. Ni, which provides no contribution to a reaction with Si, is removed by employing sulfuric acid or aqueous solution with hydrochloric acid and hydrogen peroxide water.

Figure 13A:
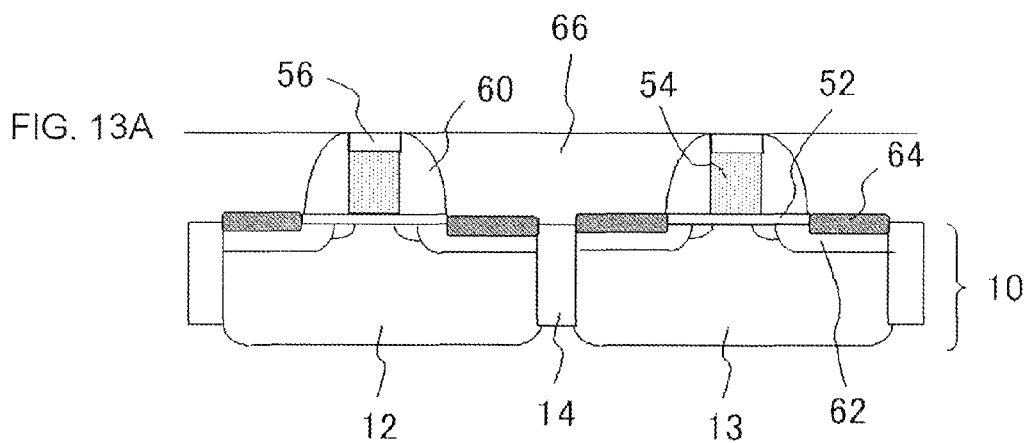
FIGS. 13A and 13B are cross-sectional views of the semiconductor device, illustrating another embodiment of the process for manufacturing the semiconductor device according to the present invention.
Figure 13B:
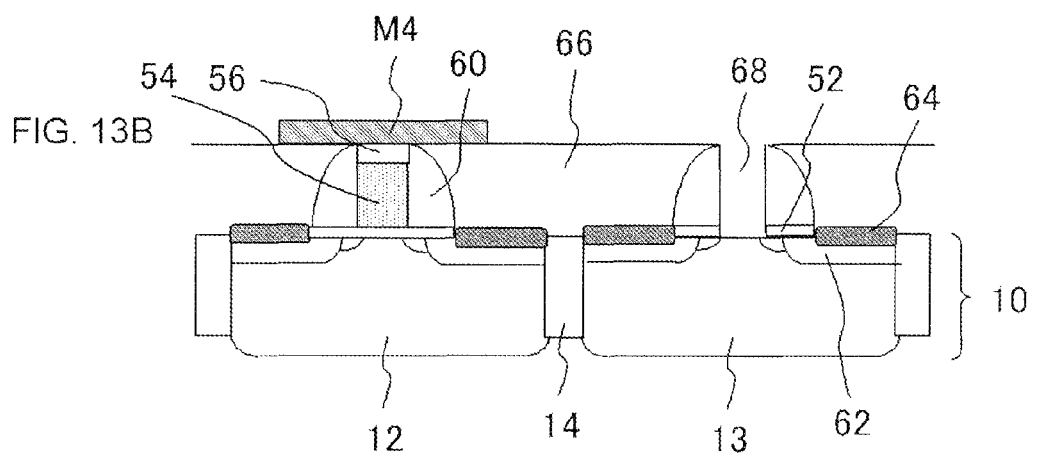

Next, an interlayer insulating film 66 is deposited by a plasma CVD process or the like. Thereafter, a planarization is performed by a chemical mechanical polishing process to expose an upper surface of the hard mask film 56 (FIG. 13A). Subsequently, a resist mask M4, which is selectively disposed, is employed to remove the hard mask film 56 of the p-MOSFET, the sacrificial gate electrode film 54 and the sacrificial gate insulating film 52. This allows forming a trench 68 for the gate insulating film and the gate electrode film (FIG. 13B).

Figure 14A:
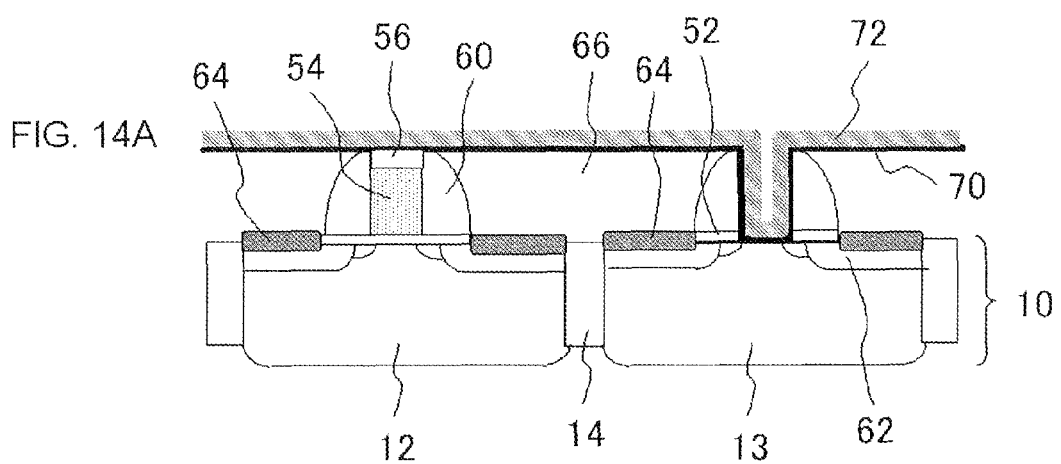
FIGS. 14A and 14B are cross-sectional views of the semiconductor device, illustrating another embodiment of the process for manufacturing the semiconductor device according to the present invention.
Figure 14B:
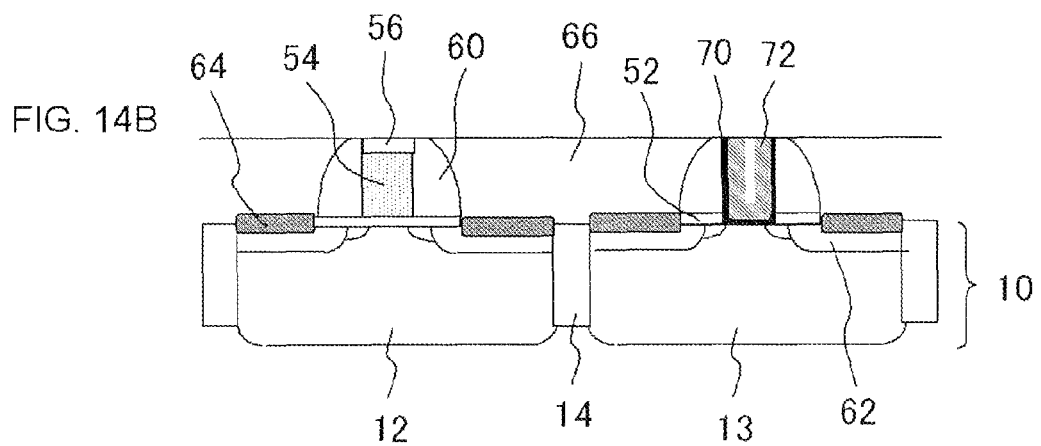

Next, the resist mask M4 is removed, and then, agate insulating film 70 and a gate electrode film 72 of the p-MOSFET are deposited. Here, the gate electrode film 72 is designed to be composed of at least two layers or more, at least one of which exhibits a tensile stress, so that the whole gate electrode film 72 exhibits a tensile stress (FIG. 14A). Subsequently, a technology of CMP or etchback is applied to selectively remove the portions of the gate insulating film 70 and the gate electrode film 72, which are not disposed in essential regions for forming the gate electrode (FIG. 14B).

Figure 15A:
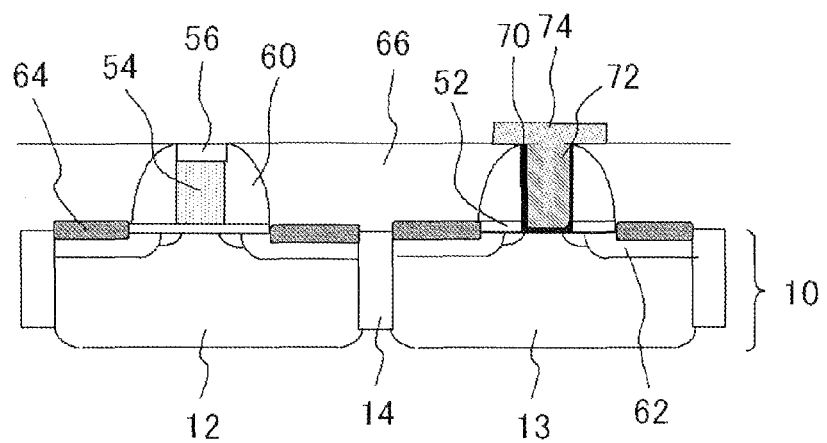
FIGS. 15A and 15B are cross-sectional views of the semiconductor device, illustrating another embodiment of the process for manufacturing the semiconductor device according to the present invention.
Figure 15B:
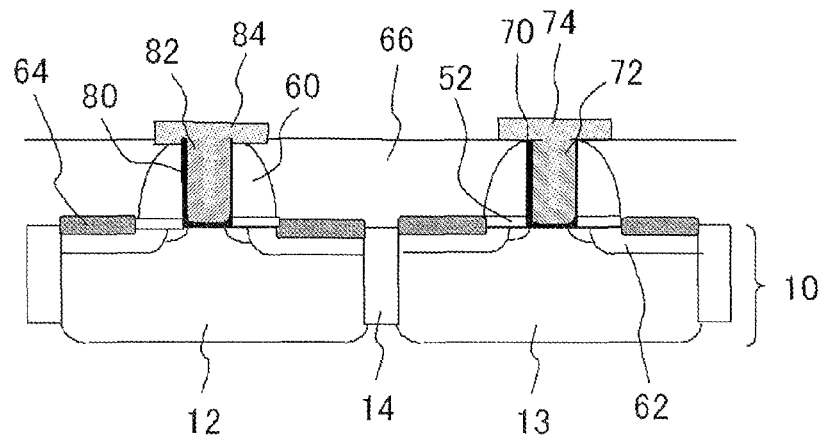

Next, a protective film 74 is formed so as to cover the gate electrode film 72 of the p-MOSFET (FIG. 15A). Such protective film 74 is preferably a silicon oxide film. The hard mask film 56, the sacrificial gate electrode film 54 and the sacrificial gate insulating film 52 of the n-MOSFET are removed through a mask of the protective film 74, similarly as in the case of the p-MOSFET. Further, a gate insulating film 80, a gate electrode film 82 and a protective film 84 are formed. The semiconductor device is thus obtained by the above-described process (FIG. 15B).

The FET and the semiconductor device and the manufacturing process according to the present invention are not limited to the above-described embodiments, and various modification may also be applicable. For example, while the above-described embodiment illustrates the semiconductor device provided with an n-channel FET and a p-channel FET, a plurality of n-channel FETs and a plurality of p-channel FETs may alternatively be provided. Further, it is not essential to include both of the n-channel FET and the p-channel FET in the semiconductor device, and only one of the n-channel FET and the p-channel FET may be provided.

While the exemplary implementation of the gate electrode composed of two films is illustrated in the above-described embodiment, the gate electrode may alternatively be composed of three or more films. For example, in FIG. 1, a TiN film or the like may be formed on each of the stressor films 24b and 34b. Having such configuration, an improved adhesiveness of the resist in the lithographic process can be achieved. When the gate electrode is composed of three or more films, it is sufficient that at least one of these films is a stressor film.

It is apparent that the present invention is not limited to the above embodiment, and may be modified and changed without departing from the scope and spirit of the invention.

What is claimed is:
1. An n-channel field effect transistor, comprising:
 a first electrode film covering an entirety of a channel region of a semiconductor substrate; and
 a second electrode film on said first electrode film, said second electrode film and said first electrode film constituting a gate electrode, wherein at least one of said first electrode film and said second electrode film is a stressor film that is capable of exhibiting a compressive stress over said semiconductor substrate, wherein each of said first electrode film and said second electrode film is composed of a metal, a metallic nitride or a metallic silicide, and wherein said gate electrode has a U-shape in which the first electrode film comprises a first pair of side portions extending from opposite ends of a first bottom portion; the second electrode film comprises a second pair of side portions extending from opposite ends of a second bottom portion; wherein interior surfaces of the first pair of side portions face each other and interior surfaces of the second pair of side portions face each other;

the n-channel field effect transistor further comprising a protective film between said interior surfaces of the first pair of side portions that face each other and the second pair of side portions that face each other and on the first bottom portion and second bottom portion;

wherein said protective film comprises silicon dioxide.

2. A semiconductor device comprising the field effect transistor of claim 1, further comprising a gate insulating film having a U-shape.

3. The semiconductor device according to claim 2, wherein a portion of the gate insulating film is between the channel region and the gate electrode.

4. The field effect transistor according to claim 1, wherein said second electrode film is said stressor film that is capable of exhibiting a compressive stress over said semiconductor substrate.

5. The field effect transistor according to claim 1, wherein said second electrode film is selected from a group consisting of tungsten, molybdenum, titanium, tantalum, and ruthenium, and a nitride thereof.

6. A p-channel field effect transistor, comprising:

a first electrode film covering an entirety of a channel region of a semiconductor substrate; and a second electrode film on said first electrode film, said second electrode film and said first electrode film constituting a gate electrode, wherein at least one of said first electrode film or said second electrode film is a stressor film that is capable of exhibiting a tensile stress for said semiconductor substrate, wherein each of said first electrode film and said second electrode film is composed of a metal, a metallic nitride or a metallic silicide, and wherein said gate electrode has a U-shape in which the first electrode film comprises a first pair of side portions extending from opposite ends of a first bottom portion; the second electrode film comprises a second pair of side portions extending from opposite ends of a second bottom portion; wherein interior surfaces of the first pair of side portions face each other and interior surfaces of the second pair of side portions face each other;

the p-channel field effect transistor further comprising a protective film between said interior surfaces of the first pair of side portions that face each other and the second pair of side portions that face each other and on the first bottom portion and second bottom portion;

wherein said protective film comprises silicon dioxide.

7. A semiconductor device comprising the field effect transistor of claim 6, further comprising a gate insulating film having a U-shape.

8. The semiconductor device according to claim 7, wherein a portion of the gate insulating film is between the channel region and the gate electrode.

9. The field effect transistor according to claim 6, wherein said second electrode film is said stressor film that is capable of exhibiting a tensile stress over said semiconductor substrate.

10. The field effect transistor according to claim 6, wherein said second electrode film is selected from a group consisting of tungsten, molybdenum, titanium, tantalum, and ruthenium, and a nitride thereof.

* * * * *